(12) United States Patent
Kindseth et al.

(10) Patent No.: US 7,315,790 B2
(45) Date of Patent: Jan. 1, 2008

(54) SYSTEM, AND METHOD FOR QUANTIFYING VOLTAGE ANOMALIES

(75) Inventors: Erik Kindseth, Goffstown, NH (US); Robert Thomas, Bedford, NH (US)

(73) Assignee: RX Monitoring Services, LLC, Bedford, NH (US)

( * ) Notice: Subject to any disclaimer, the term of this patent is extended or adjusted under 35 U.S.C. 154(b) by 0 days.

(21) Appl. No.: 11/284,557

(22) Filed: Nov. 22, 2005

(65) Prior Publication Data
US 2007/0118310 A1    May 24, 2007

(51) Int. Cl.
*G01F 19/00* (2006.01)
*H02H 3/22* (2006.01)

(52) U.S. Cl. .......................... 702/64; 361/111

(58) Field of Classification Search ............... 702/64, 702/58, 66–67, 69, 71, 73; 324/522; 361/58, 361/111, 78, 79, 86, 87
See application file for complete search history.

(56) References Cited

U.S. PATENT DOCUMENTS

| | | | |
|---|---|---|---|
| 4,191,986 A * | 3/1980 | ta Huang et al. ............. | 361/58 |
| 4,890,002 A | 12/1989 | Schornack | |
| 5,229,651 A | 7/1993 | Baxter, Jr. et al. | |
| 6,452,373 B2 * | 9/2002 | Medelius et al. ............. | 324/72 |
| 6,590,412 B2 * | 7/2003 | Sunter ......................... | 324/771 |
| 6,598,003 B1 | 7/2003 | Heino et al. | |
| 6,771,170 B2 * | 8/2004 | Papallo et al. ............... | 340/531 |
| 2005/0256922 A1 * | 11/2005 | Kim et al. .................... | 708/800 |

OTHER PUBLICATIONS

Furst et al., An Analog Method for Detecting Superimposed Power Line Voltage Disturbances, Dec. 1994, IEEE Transactions on Instrumentation and Measurement, vol. 43, No. 6, pp. 889-893.*
Ribeiro et al., Digital Signal Processing Techniques for Compression of Power Quality Disturbance Events: New Results, 2004 IEEE, pp. 448-452.*
Sabin et al., Rule-Based Algorithm for Detecting Transient Overvoltages Due to Capacitor Switching and Statistical Analysis of Capacitor Switching in Distribution Systems, 1999 IEEE, pp. 630-635.*

* cited by examiner

*Primary Examiner*—Bryan Bui
*Assistant Examiner*—Toan M. Le
(74) *Attorney, Agent, or Firm*—Grossman Tucker Perreault & Pfleger, PLLC

(57) ABSTRACT

A system and method of quantifying voltage anomalies may be used to quantify low frequency voltage transients such as the type caused by power factor correction (PFC) or similar events. The system and method of quantifying voltage anomalies receives sampled voltage data values and computes ideal sine wave data values. The system and method of quantifying voltage anomalies may also compute difference data values representing a difference between the received voltage data and the ideal sine wave and may compute score data values such as non-linear score values representing the difference data values relative to a peak voltage value or RMS voltage value.

21 Claims, 10 Drawing Sheets

EPA Event Log

| Time Stamp | Event ID | Event Type | Channel | Param1 | Param2 | Param3 | Param4 | Severity | Shape | Peak |
|---|---|---|---|---|---|---|---|---|---|---|
| Sep 06, 05 08:23:54 | 2825 | HF Volt Sensitivity | L2-L3 | 15 | | | | | | |
| Sep 06, 05 08:31:01.275 | 2826 | HF Transient | L3-G | -40 | 5 | 0 | 493 | Good | 0.01 | 0.06 |
| Sep 06, 05 08:31:02.409 | 2827 | HF Transient | L3-G | -40 | 6 | 0 | 492 | Good | 0.01 | 0.05 |
| Sep 06, 05 08:31:40.554 | 2828 | HF Transient | L3-G | -45 | 6 | 0 | 493 | Good | 0.02 | 0.09 |
| Sep 06, 05 08:31:48 | 2843 | HF Volt Sensitivity | L3-G | 20 | | | | | | |
| Sep 06, 05 08:31:48.823 | 2830 | HF Transient | L1-L2 | 40 | 150 | 298 | 494 | Good | 2.88 | 135.28 |
| Sep 06, 05 08:31:48.823 | 2832 | HF Transient | L1-N | 56 | 227 | 298 | 494 | Good | 2.89 | 1353.46 |
| Sep 06, 05 08:31:48.823 | 2829 | HF Transient | L1-G | 51 | 187 | 298 | 494 | Good | 2.88 | 134.90 |
| Sep 06, 05 08:31:48.823 | 2836 | HF Transient | L3-G | -25 | 0 | 0 | 493 | Good | 3.18 | 212.75 |
| Sep 06, 05 08:31:48.823 | 2831 | HF Transient | L3-L1 | -20 | 251 | 71 | 491 | Good | 0.11 | 9.21 |
| Sep 06, 05 08:31:48.824 | 2834 | HF Transient | L2-L3 | -45 | 251 | 191 | 494 | Good | 2.83 | 178.82 |
| Sep 06, 05 08:31:48.824 | 2835 | HF Transient | L3-N | 45 | 203 | 14 | 493 | Good | 3.16 | 211.87 |
| Sep 06, 05 08:31:48.824 | 2842 | HF Transient | L3-G | -112 | 251 | 29 | 494 | Minor | 3.05 | 202.93 |
| Sep 06, 05 08:31:48.826 | 2837 | HF Transient | L1-L2 | 40 | 51 | 355 | 493 | Good | 2.76 | 125.87 |
| Sep 06, 05 08:31:48.826 | 2838 | HF Transient | L3-L1 | 35 | 251 | 115 | 491 | Good | 0.12 | 9.95 |
| Sep 06, 05 08:31:48.826 | 2839 | HF Transient | L1-N | -30 | 251 | 21 | 494 | Good | 13.56 | 357.09 |
| Sep 06, 05 08:31:48.827 | 2833 | HF Transient | L1-G | 51 | 251 | 37 | 494 | Good | 11.85 | 332.38 |
| Sep 06, 05 08:31:48.829 | 2840 | HF Transient | L2-L3 | 51 | 105 | 300 | 494 | Good | 2.75 | 167.79 |
| Sep 06, 05 08:31:48.829 | 2841 | HF Transient | L3-N | -71 | 176 | 122 | 493 | Minor | 3.09 | 206.90 |
| Sep 06, 05 08:31:48.830 | 2844 | HF Transient | L1-L2 | -45 | 62 | 106 | 494 | Good | 18.16 | 419.21 |

Event Log Filters
- ☑ HF Transient — Trans Low [ ] volts
- ☑ Sag/Surge — Severity [Good ▼]
- ☑ HF Sensitivity

Channels
- ☑ L1->L2   ☑ L2->N
- ☑ L3->L1   ☑ L2->G
- ☑ L1->N    ☑ L3->N
- ☑ L1->G    ☑ L3->G
- ☑ L2->L3   ☑ N->G

Param
- RMS Nominal
  - Nominal Volts
- RMS Re-Nominal
  - Prev Nominal Volts
  - New Nominal Volts
- HF Transient
  - Peak
  - Duration (uSecs)
  - Phase Angle
  - Nominal Volts
- HF Volt Sensitivity
  - New Sens Val
- RMS Sag/Surge
  - Peak
  - Duration (mSecs)
  - Nominal Volts
- Line Impedance
  - Impedance in Ω
  - Nominal Volts

FIG. 8

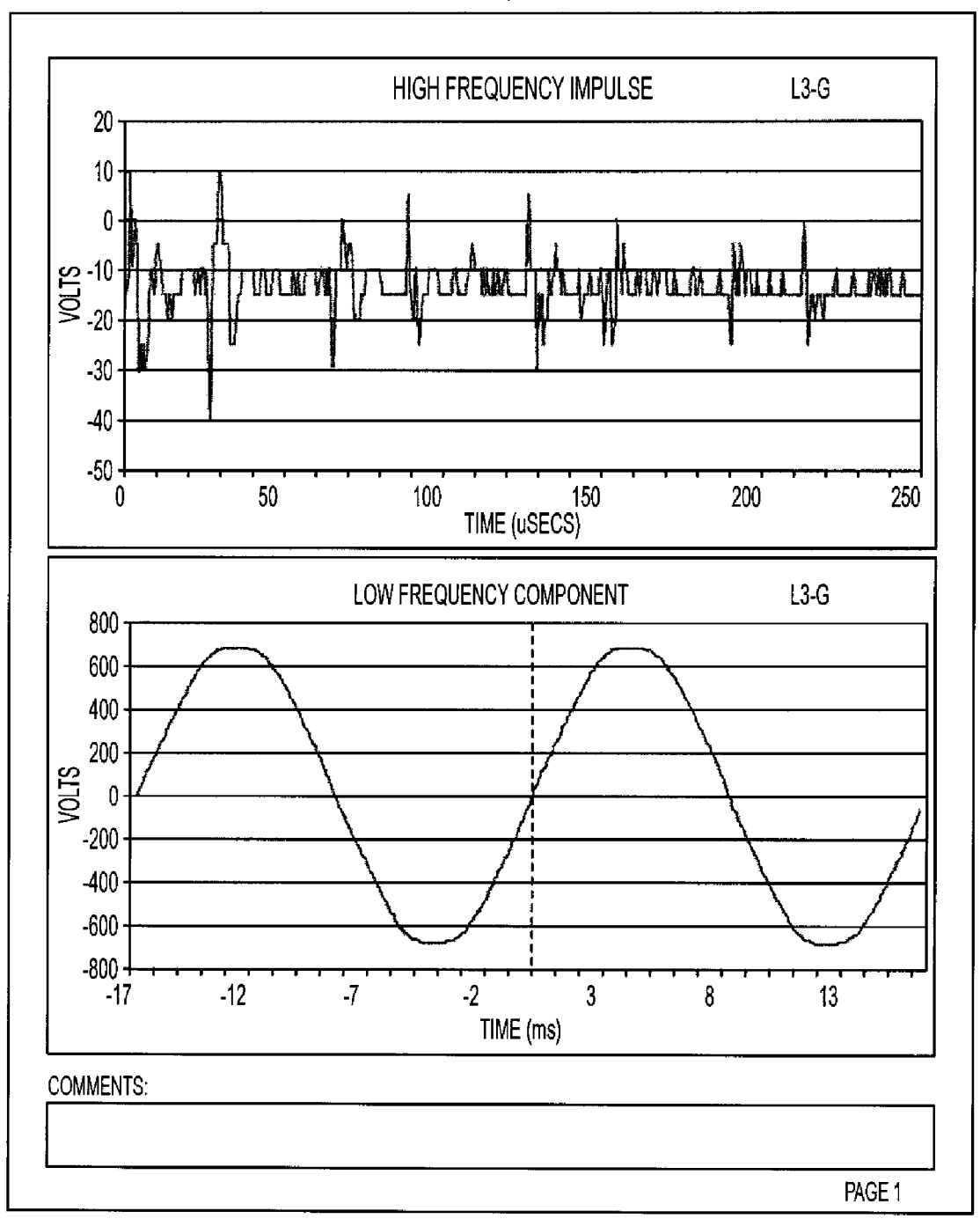
FIG. 10

SYSTEM, AND METHOD FOR QUANTIFYING VOLTAGE ANOMALIES

TECHNICAL FIELD

The present invention relates to monitoring power quality and more particularly, to a system and method for quantifying and identifying voltage anomalies.

BACKGROUND INFORMATION

As a result of the widespread use of computers and other microprocessor-based equipment, the quality of power at sites having such equipment has become increasingly important. Utility companies deliver electric power to customer sites as an alternating current (AC) voltage through a secondary power distribution system. Various distribution system and environmental factors, however, can cause power line anomalies, such as spikes, surges, sags, transients or other distortions, and can cause blackouts, brownouts, or other distribution system problems that greatly affect the quality of power received by the customer at a site. Electronic equipment, such as computers and other equipment, are susceptible to damage and/or a faulty operation as a result of power line anomalies and other poor power quality conditions.

Power monitoring equipment has been used to monitor the power quality at a site that uses electronic equipment. Power monitoring equipment may be used to record voltage data and to detect and identify power events such as spikes, sags, surges and transients. When using conventional power monitoring equipment, however, certain low frequency events may not be detected and/or identified. One example of such a low frequency event is a voltage transient caused when a discharged power-factor-correction (PFC) capacitor is switched across a line. Another example may be a voltage anomaly caused by large highly capacitive or inductive loads, e.g., HVAC, motors, etc. Although such low frequency event may be low in amplitude, they may be high in distortion and should not be ignored.

Users of existing monitoring equipment may expect to detect such low frequency events when detecting sags and swells but may overlook such events because the voltage distortion is sub cycle. Low amplitude low frequency anomalies have also been discounted and not considered to be a concern. Some existing standards, such as the CBEMA curve, classify voltage transients using peak voltage as a percentage of nominal voltage versus time. Although these existing standards may be used to identify high frequency transients, low amplitude low frequency events may not be effectively identified when using such standards.

BRIEF DESCRIPTION OF THE DRAWINGS

These and other features and advantages will be better understood by reading the following detailed description, taken together with the drawings wherein:

FIG. 8 is a screen shot of an event display including power quality event data for a plurality of detected events, consistent with one embodiment of the present invention.

FIGS. 10-12 are sample reports illustrating plots associated with selected power quality events, consistent with the one embodiment of the present invention.

DETAILED DESCRIPTION

A system and method for quantifying voltage anomalies may be used to quantify voltage anomalies such as low frequency voltage transients. A low frequency voltage anomaly may include, for example, a sub-cycle disturbance in a voltage waveform having a frequency of less than about 15 kilohertz (kHz) and more specifically less than about 10 kHz. The system and method described herein may also be used to quantify low frequency voltage anomalies that are low amplitude, for example, having an amplitude as low as 20 Volts. The system and method may be used to quantify voltage anomalies caused by, for example, power factor correction (PFC) or large highly capacitive or inductive loads.

Figure 1:
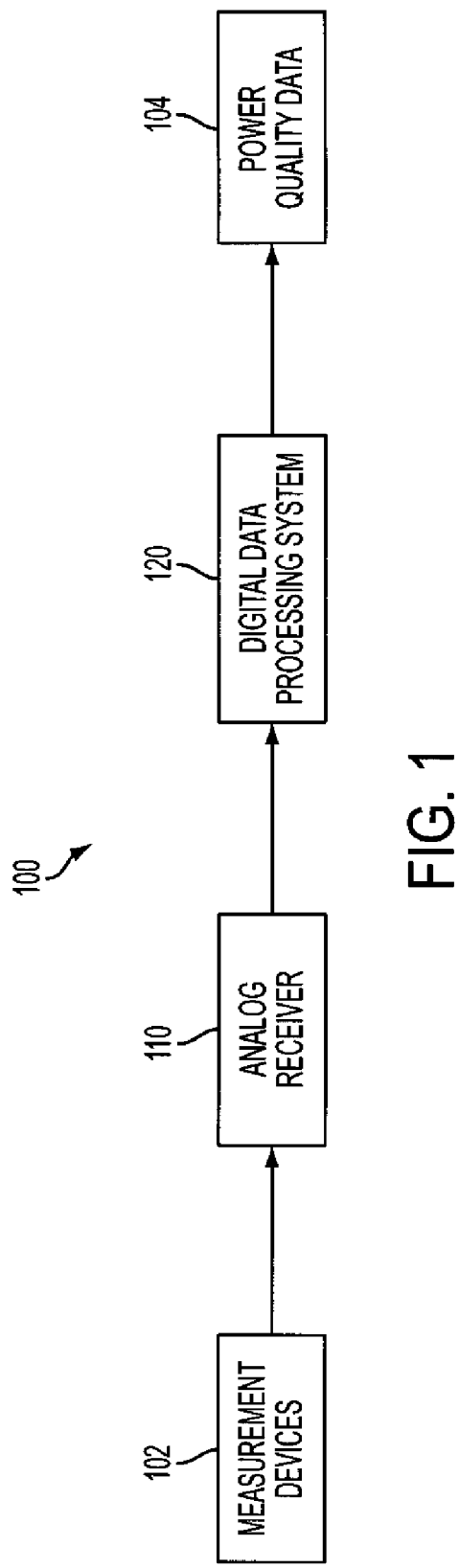
FIG. 1 is a diagrammatic illustration of a power monitoring system implementing a system and method for quantifying voltage anomalies, consistent with one embodiment of the present invention.

Referring to FIG. 1, a system and method for quantifying voltage anomalies may be implemented in a power quality monitoring system 100. The power quality monitoring system 100 may be used to monitor the quality of power provided at a site, as well as other environmental conditions that might affect the operation of electronic equipment at the site. The power quality monitoring system 100 may detect and record power events, such as spikes, sags, surges, outages and transients, may record power conditions, such as RMS volts, phase differential, A/C frequency, RMS current, line impedance and ground potential, and may record environmental conditions, such as temperature, DC volts, shock, vibration, humidity, air pressure, and dust. The system 100 may be used to monitor any type of event or condition capable of being detected or measured.

In general, the power quality monitoring system 100 may receive power measurements (e.g., voltage and current) from one or more measurement devices 102 (e.g., probes) at the site and may provide power quality data 104 representing the power quality measured on the measurement devices 102. The measurement devices 102 may provide multiple power measurement inputs, for example, voltage inputs corresponding to three phases of power, neutral and ground. The power quality data 104 may include data associated with one or more power quality events such as voltage transients or anomalies. The power quality data 104 may include time stamps associated with the occurrence of power quality events, identifiers identifying the power quality events, event type descriptions describing the type of power quality events, data parameters associated with the power quality events, and plots of data associated with the power quality events. The power quality data 104 may be presented electronically by displaying the data (e.g., on a monitor) and/or may be printed (e.g., in a report). The power quality data 104 may also be monitored in real time to provide notifications of certain identified power quality events.

The power quality monitoring system 100 may include one or more analog receivers 110 to receive and sample analog measurement signals from the measurement devices 102. The analog receiver(s) 110 may receive analog measurement signals on multiple channels, for example, multiple voltage channels corresponding to any combination of phase, ground and neutral (e.g., phase-to-phase channels, phase-to-ground channels, and phase-to-neutral channels). In one example, the analog receiver(s) 110 may sample voltage inputs at any phase-locked sample rate.

The power quality monitoring system 100 may also include a digital data processing system 120 to receive the sampled data and to process the sampled data to quantify, identify and/or report power quality events. The digital data processing system 120 may also be used to provide real time processing and event notification. The data processing system 120 may include one or more digital signal processors (DSPs) and a post-processing system. One embodiment of the power monitoring system 100 is described in greater detail in U.S. Pat. No. 6,598,003, which is assigned to the assignee of the present application and is fully incorporated herein by reference.

Figure 2:
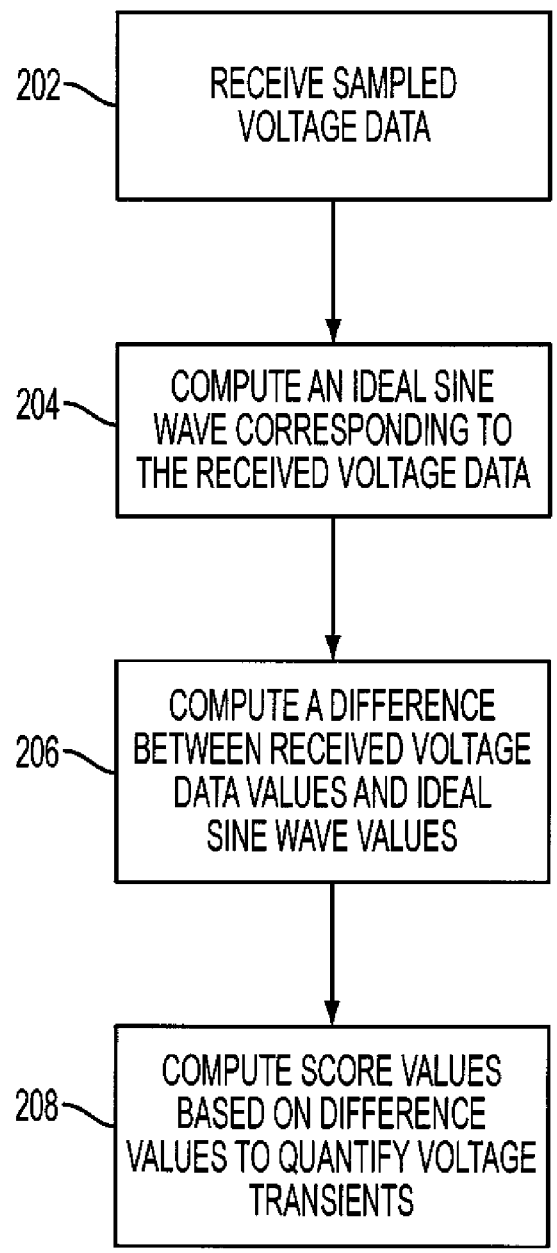
FIG. 2 is a flow chart illustrating a method of quantifying voltage anomalies, consistent with one embodiment of the present invention.
Figure 3:
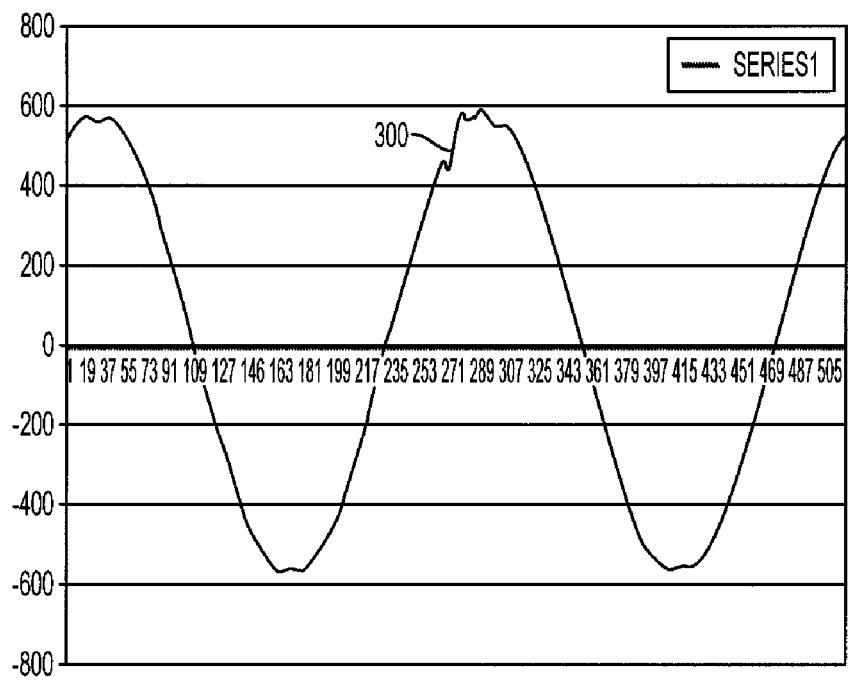
FIG. 3 is a graph illustrating a plot of sampled voltage data, consistent with one embodiment of the present invention.

An exemplary method of quantifying voltage anomalies is illustrated in FIG. 2. According to the exemplary method, sampled voltage data is received 202. The sampled voltage data may include sampled voltage data for one or more voltage channels. The sampled voltage data may include a stream of raw voltage data received, for example, from the analog receiver(s) 110. The sampled voltage data may also include voltage data associated with an identified power quality event and received, for example, from a DSP in the digital data processing system 120. A power quality event may be identified, for example, using the techniques described in U.S. Pat. No. 6,598,003. A voltage waveform 300 formed by plotting sampled voltage data values, according to one example, is shown in FIG. 3.

Figure 4:
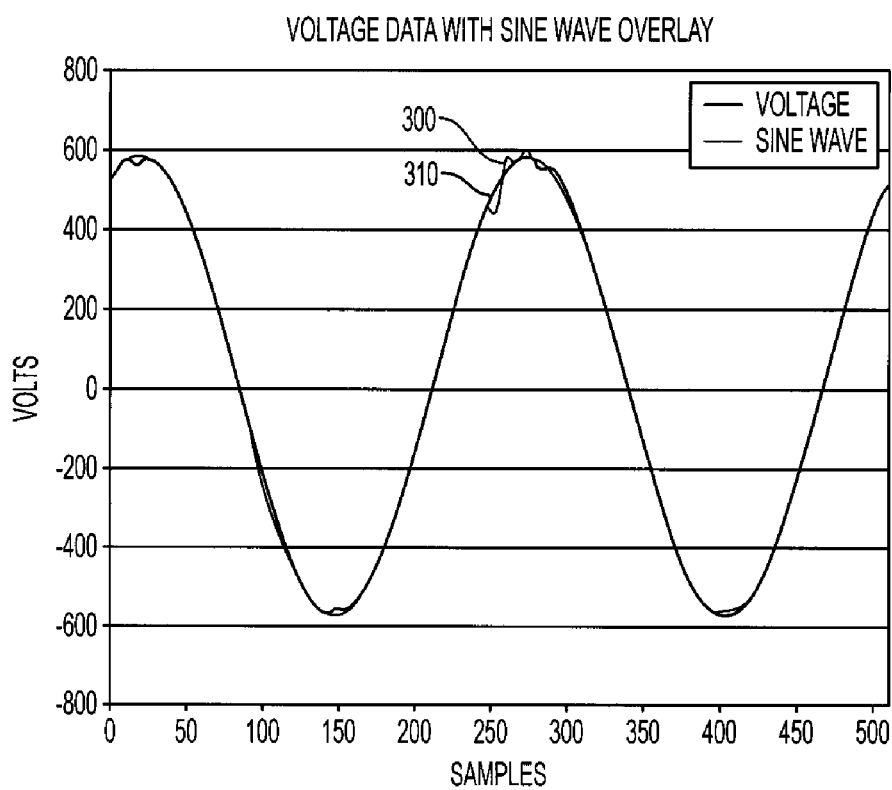
FIG. 4 is a graph illustrating a plot of sampled voltage data together with an ideal sine wave, consistent with one embodiment of the present invention.

After receiving the sampled voltage data, an ideal sine wave corresponding to the received voltage data may be computed 204. The ideal sine wave may be computed using any algorithm known to those skilled in the art for fitting a sine wave to data that is substantially sinusoidal in nature. An ideal sine wave 310 corresponding to sampled voltage data, according to one example, is shown in FIG. 4 overlaid onto the voltage waveform 300.

According to an exemplary embodiment, an ideal sine wave value may be computed for each voltage sample n as follows:

$$V\sin_n = \sin(Sangle_n) * Vpeak \quad (1)$$

where n is the sample number, $Sangle_n$ is the angle (in radians) of a particular sample n within the sine wave, and Vpeak is the peak voltage. The peak voltage Vpeak may be computed as follows:

$$Vpeak = Vrms * \sqrt{2} \quad (2)$$

where Vrms is the root mean squared (RMS) voltage of the sampled voltage data. The angle $Sangle_n$ may be computed as follows:

$$Sangle_n = (2\pi*(n+Pmag))/Scycle \quad (3)$$

where Pmag is the phase shift magnitude (in samples) and Scycle is the samples per cycle. The phase shift magnitude Pmag may be computed as follows:

$$Pmag = (Pangle/360) * Scycle \quad (4)$$

where Pangle is the phase angle (in degrees). The phase angle Pangle may be computed using any algorithm known to those skilled in the art for computing a phase angle from voltage data. In one example, phase angle may be computed using a basic zero-crossing algorithm by measuring the number of samples to the nearest zero crossing and computing a proportion of the entire 360 degree range to obtain a phase angle. Those skilled in the art will recognize that other algorithms may be used to compute the ideal sine wave.

Figure 5:
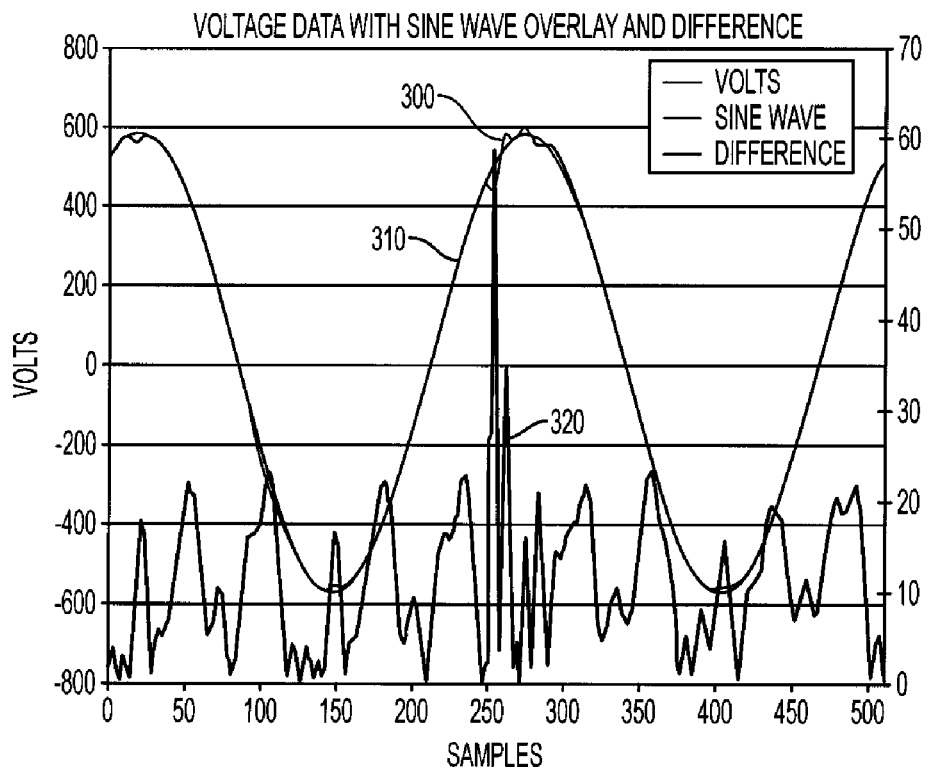
FIG. 5 is a graph illustrating a plot of sampled voltage data, an ideal sine wave and difference values, consistent with one embodiment of the present invention.

After computing the ideal sine wave, a deviation or difference between the received voltage data values and the ideal sine wave values may then be computed 206. According to an exemplary embodiment, difference values may be computed for each of the received n samples as follows:

$$V\text{diff}_n = ABS(Vsamp_n - V\sin_n) \quad (5)$$

where n is the sample number, $Vsamp_n$ is the sampled voltage value for the sample n, and $V\sin_n$ is the ideal sine wave value for the sample n. A plot 320 of the difference data values for the sampled voltage data, according to one example, is shown in FIG. 5 together with the voltage waveform 300 and the ideal sine wave 310.

Weighted deviations or score values may then be computed 208 based on the deviation or difference values relative to a reference voltage value associated with the sampled voltage data. The weighted deviations or score values may be computed such that minor fluctuations in the voltage shape are weighted less. To compute score values according to one embodiment, the deviations or difference values may be applied to a non-linear scale such that the weighted deviations or score values have a non-linear relationship with respect to the reference voltage value. The reference voltage value may be a peak voltage value from the ideal sine wave or may be a root mean squared (RMS) voltage value computed from the sampled voltage data.

Figure 6:
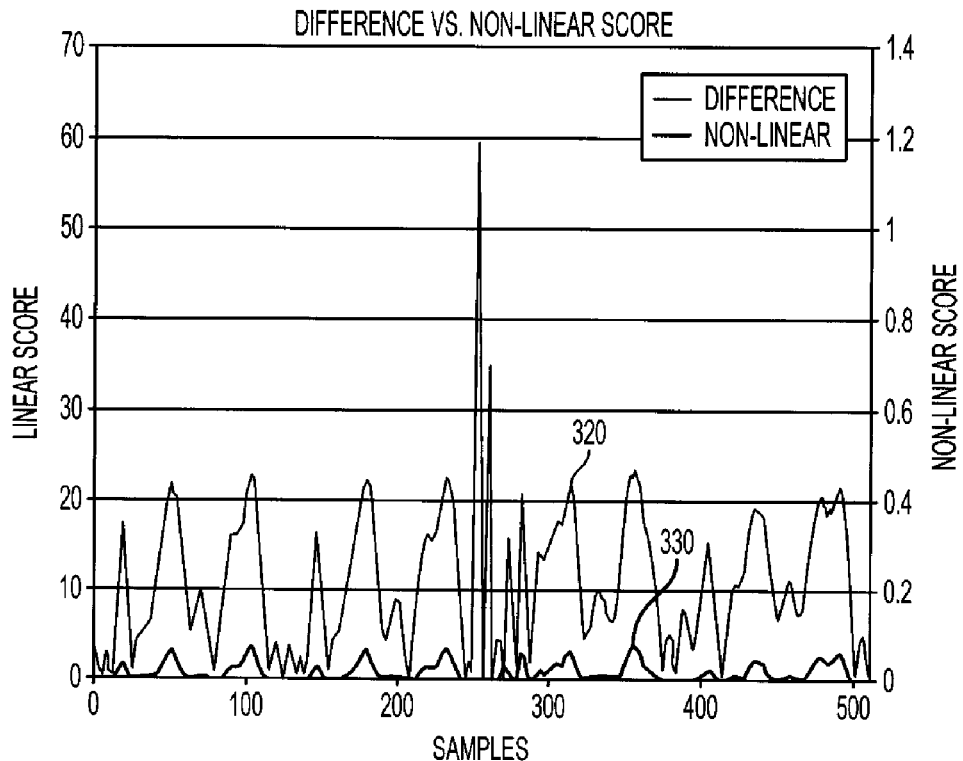
FIG. 6 is a graph illustrating a plot of difference values and corresponding non-linear score values, consistent with one embodiment of the present invention.
Figure 7:
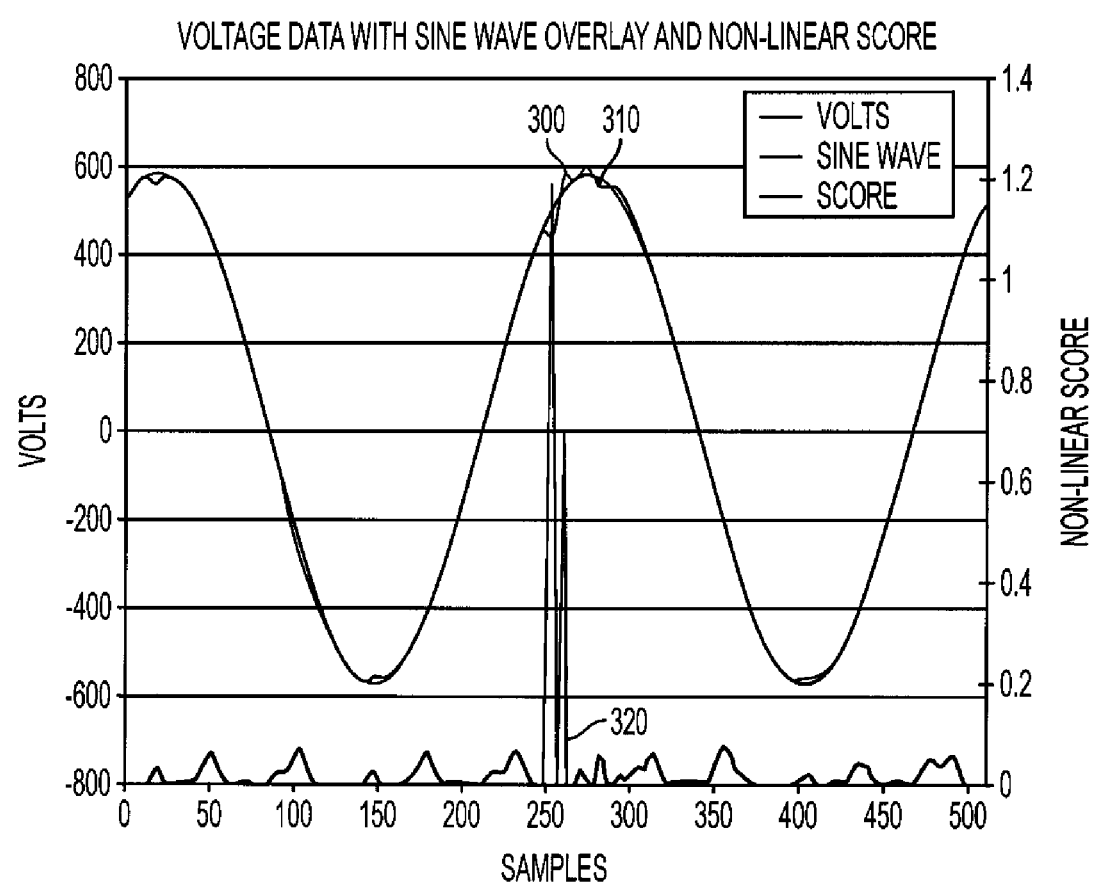
FIG. 7 is a graph illustrating a plot of sampled voltage data, an ideal sine wave and corresponding non-linear score values, consistent with one embodiment of the present invention.

According to an exemplary embodiment, non-linear score values may be computed for each voltage sample n as follows:

$$Score_n = V\text{diff}_n^3 / Vref^2 \quad (6)$$

where n is the sample number, $V\text{diff}_n$ is the difference value for the sample n, and Vref is the reference voltage for the sampled voltage data (e.g., peak voltage value or RMS voltage). A plot 330 of the non-linear score values for each of the sampled voltage data values, according to one example, is shown in FIG. 6 together with plot 320 of difference values and is shown in FIG. 7 together with voltage waveform 300 and ideal sine wave 310. Those skilled in the art will recognize that other non-linear scaling algorithms may also be used to apply the deviations to a non-linear scale to derive a weighted deviation or non-linear score value.

Computing score values may further include computing an average score value and/or a peak score value over a plurality of voltage data samples. The average and/or peak score values may be computed, for example, over a plurality of samples associated with a power quality event. According to an exemplary embodiment, the average score value may be computed by averaging the score values for the samples associated with the event and the peak score value may be computed by determining the maximum of the score values for the samples associated with the event. The peak score value may be indicative of the amplitude of a voltage anomaly and the average score value may be indicative of the distortion of a voltage anomaly.

Once computed, the score values may be used to quantify and identify power quality events for further analysis and to filter out less significant events. The average and peak score values, for example, may be compared for a plurality of events. A relatively small peak score value and a relatively large average score value, for example, may indicate a power quality event with a significant waveform distortion. A relatively large peak score value and a relatively small average score value may indicate a power quality event with a momentary disruption. The use of score values thus facilitates the quantification and identification of low frequency voltage anomalies that may otherwise be difficult to identify.

After computing score values (e.g., average score values and peak score values for events), the score values may be monitored in real time, for example, to provide automatic notification of voltage anomalies. A user or operator may provide thresholds for the peak score value and/or for the average score value to define when a voltage anomaly has occurred. When the computed score values exceed the defined thresholds, an alarm or other notification may be triggered to notify the user or operator that a potential voltage anomaly has occurred. Other power quality data and/or environmental condition data may also be processed in real time and may be considered when providing notifications. Other power quality data and/or environmental condition data may also be used to characterize the voltage anomaly or may be provided to the user or operator to assist in further characterization of the notification of the voltage anomaly.

The score values may also be evaluated using post-processing. The method may include displaying and/or printing score values together with other information (e.g., parameters, waveform plots, etc.) for review by a user. The user may thus determine which power quality events present a concern based on the score values and other parameters or information associated with the power quality events. Power quality events may be filtered based on score values (e.g., average or peak score values), for example, to reduce the number of events to review and to facilitate identifying low frequency voltage anomalies.

Referring to FIGS. 8-12, power quality event data for multiple events or an individual event may be displayed (e.g., on a monitor) and/or printed (e.g., in a report). Score values may be computed and presented with the parameters associated with power quality events such as voltage transient events. Each of the voltage transient events, for example, may include an associated average non-linear score or "shape" parameter and a peak non-linear score or "peak" parameter. Parameters may be displayed for a plurality of events to allow a user to review the events relative to other events. Individual events may also be selected (e.g., based on the parameters) and reviewed in greater detail, for example, by displaying plots of voltage and/or current data for an individual event.

FIG. 8 shows one example of an event display 800 including a power quality monitor event log 802 listing a plurality of events. Each entry in the event log 802 may include, but is not limited to, time stamps, event IDs, event type descriptions, channel identifiers, event parameters (e.g., peak voltage, duration, phase angle, nominal volts), a severity descriptor, an average non-linear score or "shape" parameter, and a peak non-linear score or "peak" parameter. The events displayed in the event log 802 may be filtered automatically based on user selectable event log filters 804. The events may be filtered, for example, based on event type, severity, and channels. Although not shown, the events may also be filtered based on the non-linear scores (i.e., shape or peak parameters), for example, by allowing a user to set threshold peak and/or average score values.

Figure 9:
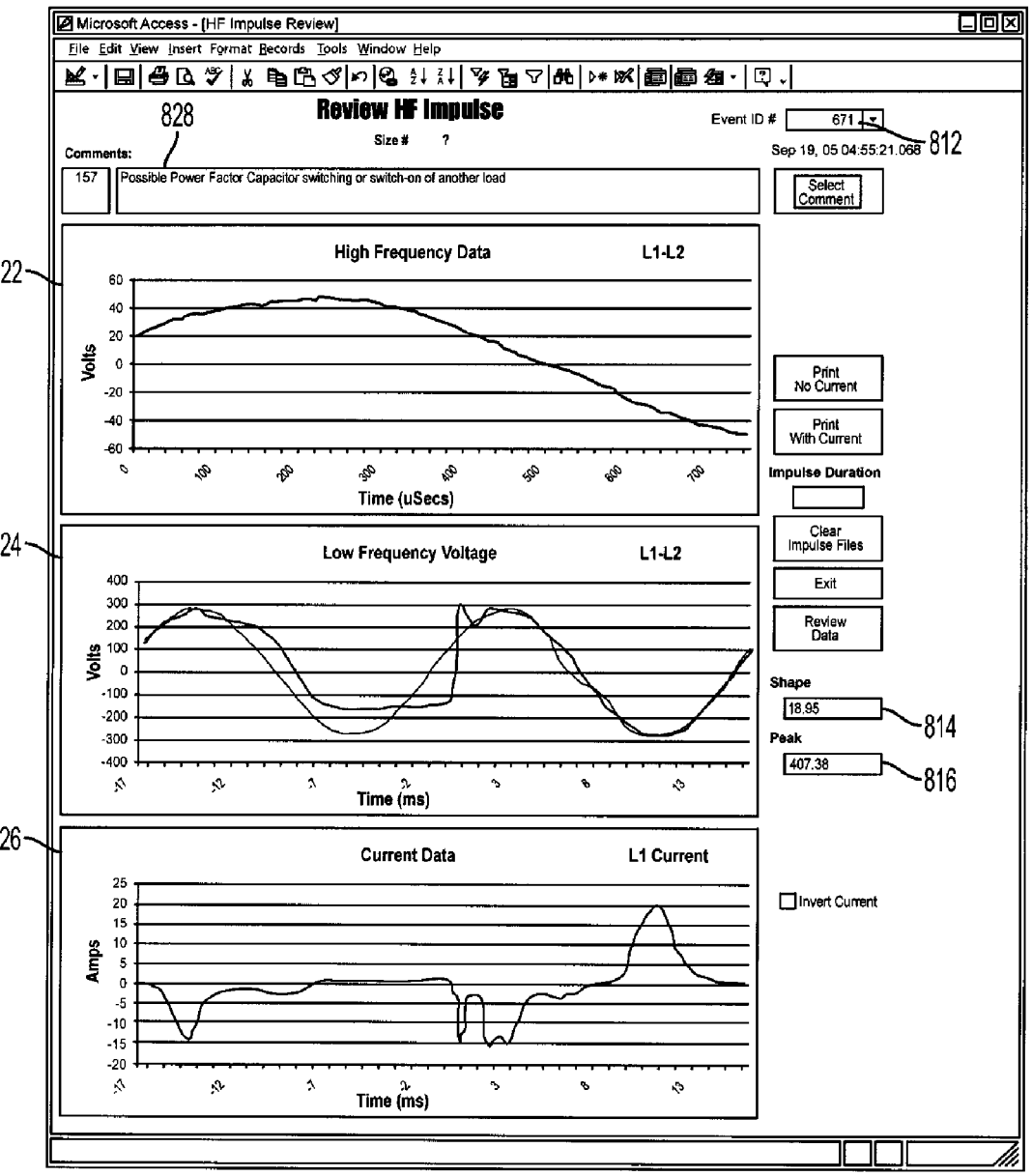
FIG. 9 is a screen shot of an event display including plots and parameters for a selected power quality event, consistent with the one embodiment of the present invention.

FIG. 9 shows another example of an event display 810 including plots and parameters associated with an individual event. According to this example, plots associated with a voltage transient event are shown together with parameters for the event. The event display 810 may include an event identifier 812, an event shape parameter (or average non-linear score) 814, and an event peak parameter (or peak non-linear score) 816. A high frequency data plot 822 may be displayed to reveal any high frequency voltage impulses. A low frequency voltage plot 824 may be displayed including the voltage data waveform and the ideal sine wave to reveal low frequency voltage components. A current data plot 826 may also be displayed to reveal the effect of the event on current. The event display 810 may also provide a field 828 for entry of comments to be associated with the event, for example, describing the nature of the event (e.g., a low frequency transient) and/or identifying a possible cause of the event (e.g., a PFC event). The user's comments may be based on the plots, the shape and peak parameters, and other parameters or information associated with the event.

In this example, a shape value of 21 indicates significant waveform distortion and possibly multiple zero crossings and a peak value of 266 indicates the energy amplitude of the transient. These scores indicate that the exemplary event is possibly a PFC event or similar voltage anomaly. In contrast, the amplitude of the high frequency component (55 V) alone may be insufficient to identify this event and the event may not be classified as a sag or an impulse. Other parameters, plots or information may also be reviewed to evaluate the nature of the power event.

Figure 11:
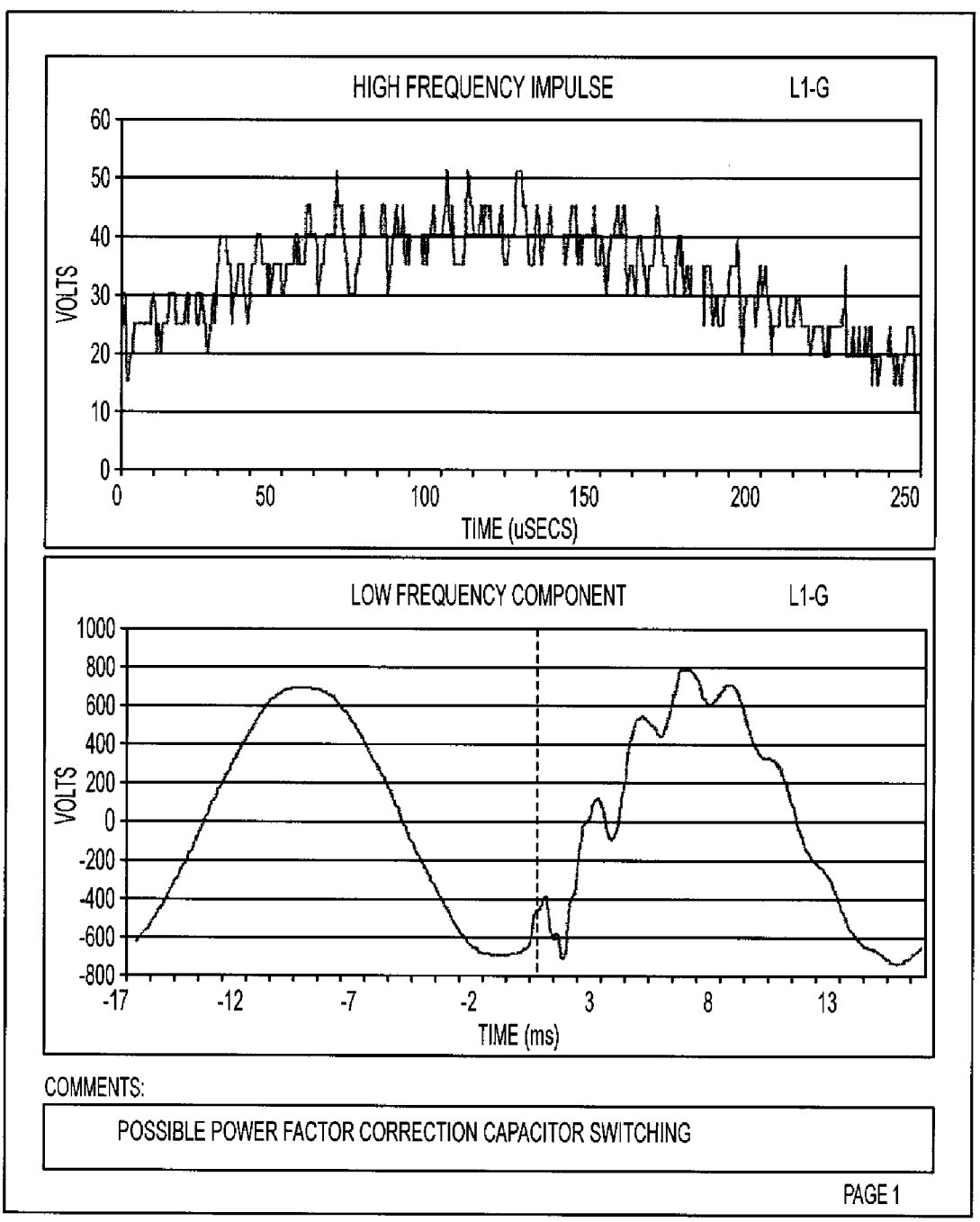
Figure 12:
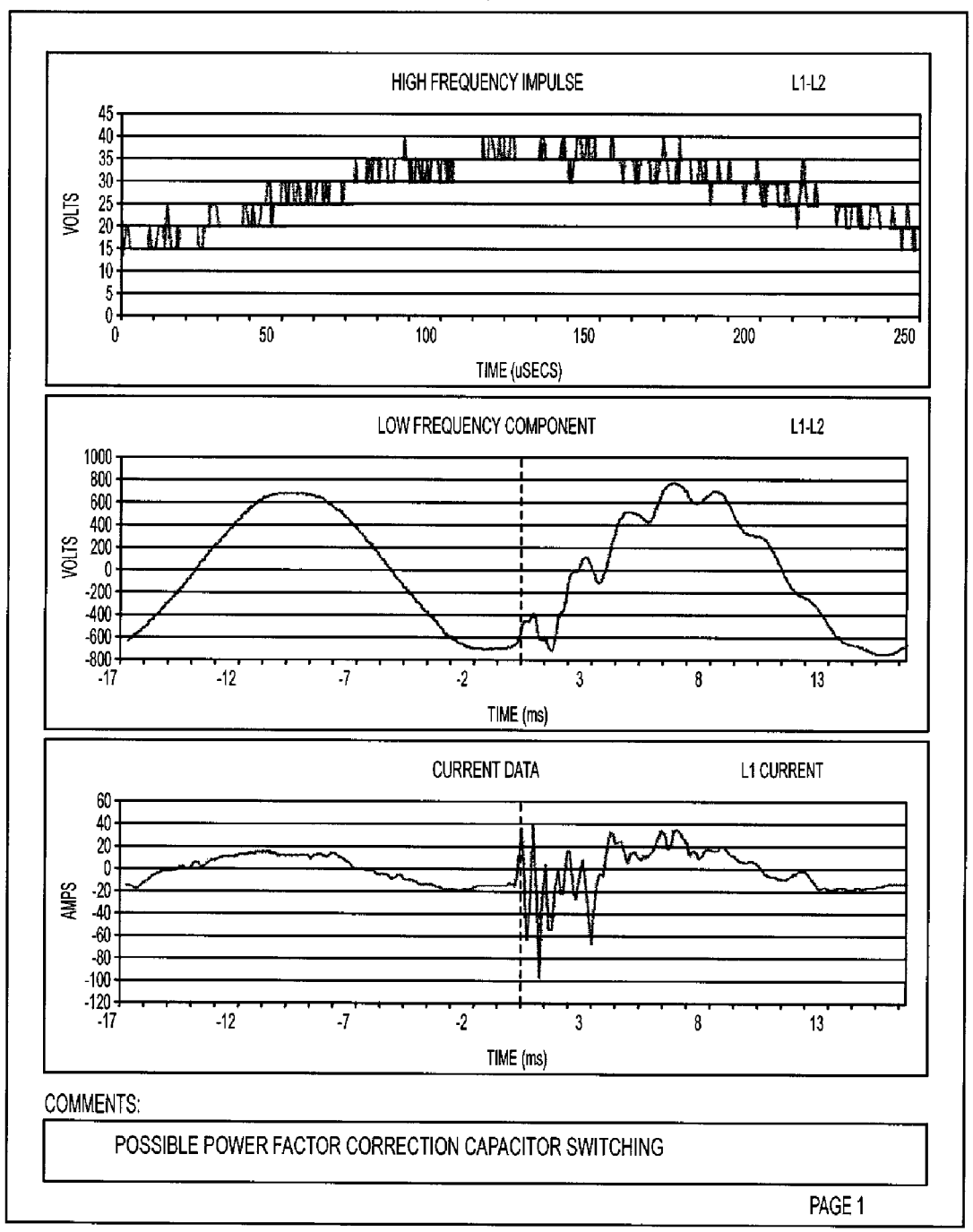

FIGS. 10-12 show examples of event reports for individual transient events. The event reports may be printed, for example, from the event display 810. The reports may include the plots described above and identifying information for the event. The reports may also include any comments added to the display, as described above. The events shown in FIGS. 10 and 11 have equivalent high frequency amplitudes. Using conventional techniques, the event shown in FIG. 11 may not have been distinguished from the event shown in FIG. 10. Using the method described above, however, the event shown in FIG. 11 may be distinguished based on the score values. The average non-linear score value is much higher for the event shown in FIG. 11 indicating a higher degree of distortion despite the equivalent high frequency amplitude.

The computations of the ideal sine wave, the difference values and the non-linear score values, according to the exemplary method, may be performed using the data processing system 120 (see FIG. 1). One or more digital signal processors (DSPs) may process sampled voltage data received from the analog receiver(s) 110 to produce the score values. Alternatively, a post-processing system may process sampled voltage data received from one or more DSPs to produce the score values. The data processing system 120 may also be used to display and/or print the score values with the power quality data 104, to filter power quality events based on the score values, and/or to provide the real time processing and automatic notification of voltage anomalies. The data processing system 120 may use a database application known to those skilled in the art, such as a Microsoft Access database, to organize and present the power quality event data.

Embodiments of the methods described above may be implemented using hardware, software, firmware or combinations thereof. Embodiments of the software may be implemented as a computer program product for use with a computer system. Such implementation includes, without limitation, a series of computer instructions that embody all or part of the functionality previously described herein with respect to the system and method. The series of computer instructions may be stored in any machine-readable medium, such as semiconductor, magnetic, optical or other memory devices, and may be transmitted using any communications technology, such as optical, infrared, microwave, or other transmission technologies. It is expected that such a computer program product may be distributed as a removable machine-readable medium (e.g., a diskette, CD-ROM), preloaded with a computer system (e.g., on system ROM or fixed disk), or distributed from a server or electronic bulletin board over the network (e.g., the Internet or World Wide Web).

Those skilled in the art should appreciate that such computer instructions can be written in a number of programming languages for use with many computer architectures or operating systems. For example, preferred embodiments may be implemented in a procedural programming language (e.g., "C") or an object oriented programming language (e.g., "C++" or Java). Alternative embodiments of the invention may be implemented as pre-programmed hardware elements or as a combination of hardware and software.

In summary, consistent with one embodiment of the present invention, a method of quantifying voltage anomalies includes: receiving sampled voltage data representing voltage measured on at least one voltage input; computing an ideal sine wave corresponding to the voltage data; computing a difference between values of the voltage data and values of the ideal sine wave to generate difference values; and computing score values based on the difference values relative to a reference voltage value associated with the sampled voltage data, wherein the score values quantify voltage anomalies in the voltage measured on the voltage input.

Consistent with another embodiment of the present invention, a power quality monitoring system includes at least one analog receiver configured to receive at least one analog voltage measurement and to convert the analog voltage measurement into sampled voltage data and at least one data processor coupled to the analog receiver and configured to process the sampled voltage data. The digital signal processor is configured to compute an ideal sine wave corresponding to the sampled voltage data, to compute a difference between values of the voltage data and values of the ideal sine wave to generate difference values, and to compute score values based on the difference values relative to a reference voltage value associated with the sampled voltage data. The score values quantify voltage anomalies in the voltage measurement.

While the principles of the invention have been described herein, it is to be understood by those skilled in the art that this description is made only by way of example and not as a limitation as to the scope of the invention. Other embodiments are contemplated within the scope of the present invention in addition to the exemplary embodiments shown and described herein. Modifications and substitutions by one of ordinary skill in the art are considered to be within the scope of the present invention, which is not to be limited except by the following claims.

What is claimed is:

1. A method of quantifying voltage anomalies to evaluate power quality at a site being monitored, said method comprising:

receiving sampled voltage data representing voltage measured on at least one voltage input at the site being monitored;

computing an ideal sine wave corresponding to said voltage data;

computing a difference between values of said voltage data and values of said ideal sine wave to generate difference values; and computing score values based on said difference values relative to a reference voltage value associated with said sampled voltage data, wherein said score values include non-linear score values with a non-linear relationship to said reference voltage value, wherein said score values quantify voltage anomalies in said voltage measured on said at least one voltage input at the site being monitored and are indicative of power quality at the site being monitored.

2. The method of claim 1 further comprising:

generating a voltage data plot from said sampled voltage data; and overlaying said ideal sine wave onto said voltage data plot.

3. The method of claim 1 further comprising monitoring said score values in real time to identify said voltage anomalies.

4. The method of claim 3 further comprising:

comparing said score values to threshold score values to identify a voltage anomaly; and providing a notification of said identified voltage anomaly.

5. The method of claim 1 wherein said voltage anomalies include low frequency voltage transients.

6. The method of claim 1 wherein said voltage anomalies include a sub-cycle disturbance in a voltage waveform having that has a frequency less than 15 kilohertz.

7. The method of claim 1 wherein said voltage anomalies are caused by power factor correction (PFC).

8. The method of claim 1 further comprising identifying power quality events, wherein said sampled voltage data is associated with said power quality events.

9. The method of claim 8 further comprising:

computing average score values from said score values associated with each of said power quality events and peak score values from said score values associated with each of said power quality events; and identifying at least one of said power quality events as a voltage anomaly based on said average score values and said peak score values.

10. The method of claim 9 wherein identifying said at least one of said power quality events comprises:

monitoring said average score values and said peak score values in real time;

comparing said score values to threshold score values to identify said voltage anomaly; and providing a notification of said identified voltage anomaly.

11. The method of claim 9 further comprising generating at least one event report for at least one of said power quality events identified as a voltage anomaly.

12. The method of claim 11 wherein said at least one report includes plots and identifying information.

13. The method of claim 1 wherein said reference voltage value is a peak voltage value or a root mean squared (RMS) voltage value.

14. The method of claim 1 said non-linear score values are determined according to the following equation: $Vdiff^3/Vref^2$, where Vdiff is a difference value and Vref is a RMS voltage value.

15. The method of claim 1 further comprising computing an average score value from said score values.

16. The method of claim 1 further comprising computing a peak score value from said score values.

17. A machine-readable medium whose contents cause a computer system to perform a method for quantifying voltage anomalies to evaluate power quality at a site being monitored, said method comprising:
receiving sampled voltage data representing voltage measured on at least one voltage input at the site being monitored;
computing an ideal sine wave corresponding to said voltage data;
computing a difference between values of said voltage data and values of said ideal sine wave to generate difference values; and
computing score values based on said difference values relative to a reference voltage value associated with said sampled voltage data, wherein said score values include non-linear score values with a non-linear relationship to said reference voltage value, wherein said score values quantify voltage anomalies in said voltage measured on said at least one voltage input at the site being monitored and are indicative of power quality at the site being monitored.

18. The machine readable medium of claim 17 wherein said sampled voltage data is associated with power quality events, and wherein the method further comprises:
computing average score values from said score values associated with each of said power quality events and peak score values from said score values associated with each of said power quality events; and
identifying at least one of said power quality events as a voltage anomaly based on said average score values and said peak score values.

19. The machine readable medium of claim 17 wherein said reference voltage value is a RMS voltage value.

20. A power monitoring system comprising:
at least one analog receiver configured to receive at least one analog voltage measurement at a site being monitored and to convert said analog voltage measurement into sampled voltage data;
at least one data processor coupled to said analog receiver and configured to process said sampled voltage data, wherein said data processor is configured to compute an ideal sine wave corresponding to said sampled voltage data, to compute a difference between values of said voltage data and values of said ideal sine wave to generate difference values, and to compute score values based on said difference values relative to a reference voltage value associated with said sampled voltage data, wherein said score values include non-linear score values with a non-linear relationship to said reference voltage value, wherein said score values quantify voltage anomalies in said voltage measurement at the site being monitored and are indicative of power quality at the site being monitored.

21. The system of claim 20 wherein said score values include non-linear score values with a non-linear relationship to a RMS voltage value computed from said sampled voltage data.

* * * * *